United States Patent
Sharifi et al.

(10) Patent No.: US 10,269,996 B1
(45) Date of Patent: Apr. 23, 2019

(54) LOW COST, HIGH PERFORMANCE BARRIER-BASED POSITION SENSITIVE DETECTOR ARRAYS

(71) Applicant: HRL Laboratories, LLC, Malibu, CA (US)

(72) Inventors: Hasan Sharifi, Agoura Hills, CA (US); Rajesh D. Rajavel, Oak Park, CA (US); Terence J. De Lyon, Newbury Park, CA (US); Daniel Yap, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 406 days.

(21) Appl. No.: 15/222,886

(22) Filed: Jul. 28, 2016

Related U.S. Application Data

(62) Division of application No. 13/930,862, filed on Jun. 28, 2013, now Pat. No. 9,444,001.

(51) Int. Cl.

| | | |
|---|---|---|
| H01L 21/00 | (2006.01) | |
| H01L 31/0392 | (2006.01) | |
| H01L 21/66 | (2006.01) | |
| H01L 31/0304 | (2006.01) | |
| H01L 31/0224 | (2006.01) | |
| H01L 31/109 | (2006.01) | |
| H01L 31/18 | (2006.01) | |
| G01B 11/14 | (2006.01) | |

(52) U.S. Cl.
CPC ......... *H01L 31/0392* (2013.01); *G01B 11/14* (2013.01); *H01L 22/14* (2013.01); *H01L 31/022408* (2013.01); *H01L 31/03046* (2013.01); *H01L 31/109* (2013.01); *H01L 31/1844* (2013.01)

(58) Field of Classification Search
CPC ......... H01L 31/0392; H01L 31/022408; H01L 31/03046; H01L 31/109; H01L 31/1844; H01L 22/14; H01L 31/00–31/208
USPC ................... 438/69, 72, 76, 77, 84
See application file for complete search history.

(56) References Cited

U.S. PATENT DOCUMENTS

| | | |
|---|---|---|
| 3,864,722 A | 2/1975 | Carnes |
| 5,905,272 A | 5/1999 | Moise |
| 6,043,549 A | 3/2000 | Gutierrez-Aitken |
| 6,043,550 A | 3/2000 | Kuhara |
| 6,107,652 A | 8/2000 | Scavennec |
| 6,697,413 B2 | 2/2004 | Hwang |
| 6,720,589 B1 | 4/2004 | Shields |
| 6,995,445 B2 | 2/2006 | Forrest |
| 7,678,594 B2 | 3/2010 | Katsuyama |

(Continued)

OTHER PUBLICATIONS

Wolfshagen, et al. "HgCdTe Position Sensitive Detector (PSD) Development" by Oceanit Laboratories Inc. 2010.

(Continued)

*Primary Examiner* — Kevin M Picardat
(74) *Attorney, Agent, or Firm* — Ladas & Parry

(57) ABSTRACT

A position sensitive detector includes a substrate, an absorber layer on the substrate, a barrier layer on the absorber layer, a contact layer on the barrier layer, and a first contact and a second contact on the contact layer. The barrier layer prevents a flow of majority carriers from the absorber layer to the contact layer. The position sensitive detector is sensitive to a lateral position between the first contact and the second contact of incident light on the contact layer.

12 Claims, 5 Drawing Sheets

(56) References Cited

U.S. PATENT DOCUMENTS

| | | |
|---|---|---|
| 7,786,508 B2 | 8/2010 | Perera et al. |
| 8,134,581 B2 * | 3/2012 | Burberry ............ G02F 1/133707 |
| | | 345/691 |
| 8,299,497 B1 | 10/2012 | Klem et al. |
| 8,368,168 B2 | 2/2013 | Takatani |
| 8,450,773 B1 | 5/2013 | Kim et al. |
| 8,502,271 B2 | 8/2013 | Scott |
| 8,831,055 B2 | 9/2014 | Watanabe et al. |
| 8,835,979 B1 | 9/2014 | De Lyon |
| 8,928,036 B2 | 1/2015 | Ting et al. |
| 9,099,371 B1 | 8/2015 | Crook |
| 9,444,001 B1 | 9/2016 | Sharifi et al. |
| 2004/0119093 A1 | 6/2004 | Cohen |
| 2005/0259211 A1 * | 11/2005 | Stephenson ......... G02F 1/13718 |
| | | 349/167 |
| 2007/0132375 A1 | 6/2007 | Bachmann |
| 2007/0215900 A1 | 9/2007 | Maimon |
| 2008/0043796 A1 | 2/2008 | Jikutani |
| 2010/0097105 A1 * | 4/2010 | Morita ................ H01L 27/0605 |
| | | 327/109 |
| 2010/0236628 A1 | 9/2010 | Schmidt |
| 2011/0037097 A1 * | 2/2011 | Scott ...................... B82Y 20/00 |
| | | 257/184 |
| 2011/0294254 A1 | 12/2011 | Jackrel et al. |
| 2011/0309410 A1 * | 12/2011 | Maimon ................ B82Y 20/00 |
| | | 257/184 |
| 2012/0171847 A1 | 7/2012 | Robinson |
| 2012/0280350 A1 * | 11/2012 | Smith ............... H01L 31/02024 |
| | | 257/448 |
| 2013/0214373 A9 | 8/2013 | Scott et al. |
| 2013/0237003 A1 | 9/2013 | Smith |
| 2014/0291480 A1 | 10/2014 | Bruder |

OTHER PUBLICATIONS

From U.S. Appl. No. 13/930,862 (now U.S. Pat. No. 9,444,001) Restriction Requirement dated Jul. 22, 2014.

From U.S. Appl. No. 13/930,862 (now U.S. Pat. No. 9,444,001) Notice of Allowance dated May 2, 2016.

From U.S. Appl. No. 13/930,862 (now U.S. Pat. No. 9,444,001) NFOA dated Sep. 16, 2014.

From U.S. Appl. No. 13/930,862 (now U.S. Pat. No. 9,444,001) NFOA dated Nov. 30, 2015.

From U.S. Appl. No. 13/930,862 (now U.S. Pat. No. 9,444,001) NFOA dated Apr. 30, 2015.

From U.S. Appl. No. 13/930,862 (now U.S. Pat. No. 9,444,001) NFOA dated Apr. 13, 2016.

From U.S. Appl. No. 13/930,862 (now U.S. Pat. No. 9,444,001) FOA dated Sep. 29, 2015.

From U.S. Appl. No. 13/930,862 (now U.S. Pat. No. 9,444,001) FOA dated Jan. 26, 2015.

From U.S. Appl. No. 13/930,862 (now U.S. Pat. No. 9,444,001) Advisory Action dated Mar. 18, 2015.

* cited by examiner

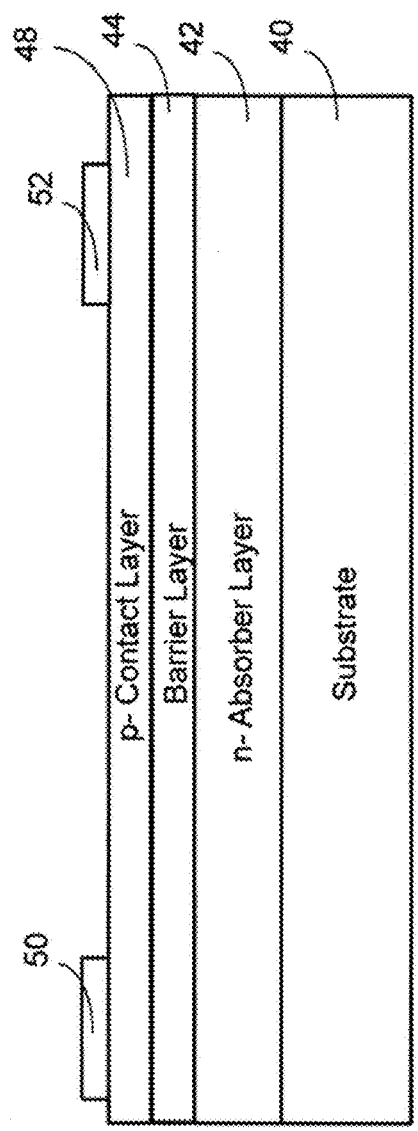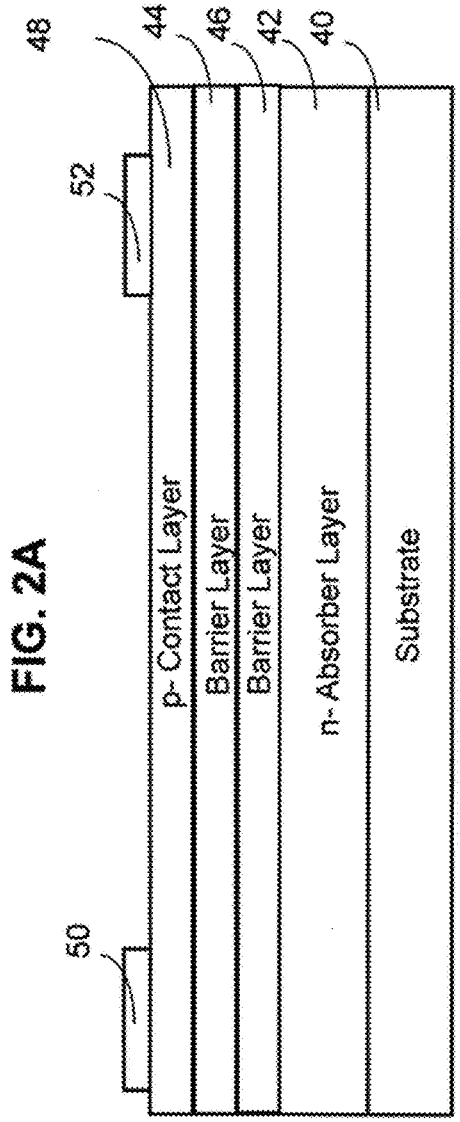

| PROVIDING A SUBSTRATE | 100 |

| FORMING AN ABSORBER LAYER ON THE SUBSTRATE | 102 |

| FORMING A BARRIER LAYER ON THE ABSORBER LAYER | 104 |

| FORMING A CONTACT LAYER ON THE BARRIER LAYER | 106 |

| FORMING A FIRST CONTACT AND A SECOND CONTACT ON THE CONTACT LAYER, | 108 |

| WHEREIN THE BARRIER LAYER PREVENTS A FLOW OF MAJORITY CARRIERS FROM THE ABSORBER LAYER TO THE CONTACT LAYER | 110 |

| WHEREIN THE POSITION SENSITIVE DETECTOR IS SENSITIVE TO A LATERAL POSITION BETWEEN THE FIRST CONTACT AND THE SECOND CONTACT OF INCIDENT LIGHT ON THE CONTACT LAYER | 112 |

| DETERMINING THE LATERAL POSITION $X$ OF THE INCIDENT LIGHT BY $X = 0.5L^*(I_A - I_B)/(I_A + I_B)$; WHERE L IS A DISTANCE BETWEEN THE FIRST CONTACT AND THE SECOND CONTACT; WHERE $I_A$ IS A CURRENT AT THE FIRST CONTACT; AND WHERE $I_B$ IS A CURRENT AT THE SECOND CONTACT | 114 |

FIG. 5 ive detector comprises a substrate, an absorber layer on the substrate, a barrier layer on the absorber layer, a contact layer on the barrier layer, and a first contact and a second contact on the contact layer, wherein the barrier layer prevents a flow of majority carriers from the absorber layer to the contact layer, and wherein the position sensitive detector is sensitive to a lateral position between the first contact and the second contact of incident light on the contact layer.

LOW COST, HIGH PERFORMANCE BARRIER-BASED POSITION SENSITIVE DETECTOR ARRAYS

CROSS REFERENCE TO RELATED APPLICATIONS

This application claims the benefit of and is a divisional of U.S. patent application Ser. No. 13/930,862 filed on Jun. 28, 2013, which is incorporated in full herein by reference.

TECHNICAL FIELD

This disclosure relates to position sensitive detectors, and in particular to short wave infrared (SWIR) to mid wave infrared (MWIR) position sensitive detectors.

BACKGROUND

In the prior art, position sensitive detectors (PSDs) have used high-performance HgCdTe infrared material for an absorber layer, as described by R. Wolfshagen, et al. in "HgCdTe Position Sensitive Detector (PSD) Development" by Oceanit Laboratories Inc. 2010. Using HgCdTe infrared material for an absorber layer requires very expensive substrates that are not available in large diameter. Attempts have been made to grow HgCdTe on silicon substrates for low cost and large format arrays; however, the resulting epi quality has high defect densities. The prior art also relies on processes for fabrication of II-VI material, which are processes that are immature and expensive compared to III-V processes.

In the prior art position sensitive detectors (PSD) use PN junction devices, which require low temperature operation to reduce both diffusion and generation-recombination currents. For example, InSb material can be used for PSD arrays, but needs to be operated at 77 degrees Kelvin, and suffers from a short wave infrared (SWIR) cutoff. InGaAs PN junction-based PSD arrays are commercially available, but are useful for only the visible to near infrared (NIR) wavelengths. HgCdTe material is presently used for extended wavelengths such as mid wave infrared (MWIR), but using HgCdTe material is expensive, as discussed above.

What is needed is a position sensitive detector that is low cost and high performance, which can operate from the short wave infrared (SWIR) to mid wave infrared (MWIR) wavelengths. The embodiments of the present disclosure answer these and other needs.

SUMMARY

In a first embodiment disclosed herein, a position sensitive detector comprises a substrate, an absorber layer on the substrate, a barrier layer on the absorber layer, a contact layer on the barrier layer, and a first contact and a second contact on the contact layer, wherein the barrier layer prevents a flow of majority carriers from the absorber layer to the contact layer, and wherein the position sensitive detector is sensitive to a lateral position between the first contact and the second contact of incident light on the contact layer.

In another embodiment disclosed herein, a method of providing a position sensitive detector comprises providing a substrate, forming an absorber layer on the substrate, forming a barrier layer on the absorber layer, forming a contact layer on the barrier layer, and forming a first contact and a second contact on the contact layer, wherein the barrier layer prevents a flow of majority carriers from the absorber layer to the contact layer, and wherein the position sensitive detector is sensitive to a lateral position between the first contact and the second contact of incident light on the contact layer.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 2A shows an elevation sectional view of a position sensitive detector in accordance with the present disclosure;

FIG. 2B shows an elevation sectional view of another position sensitive detector in accordance with the present disclosure;

FIG. 5 shows a method to fabricate a position sensitive detector in accordance with the present disclosure.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
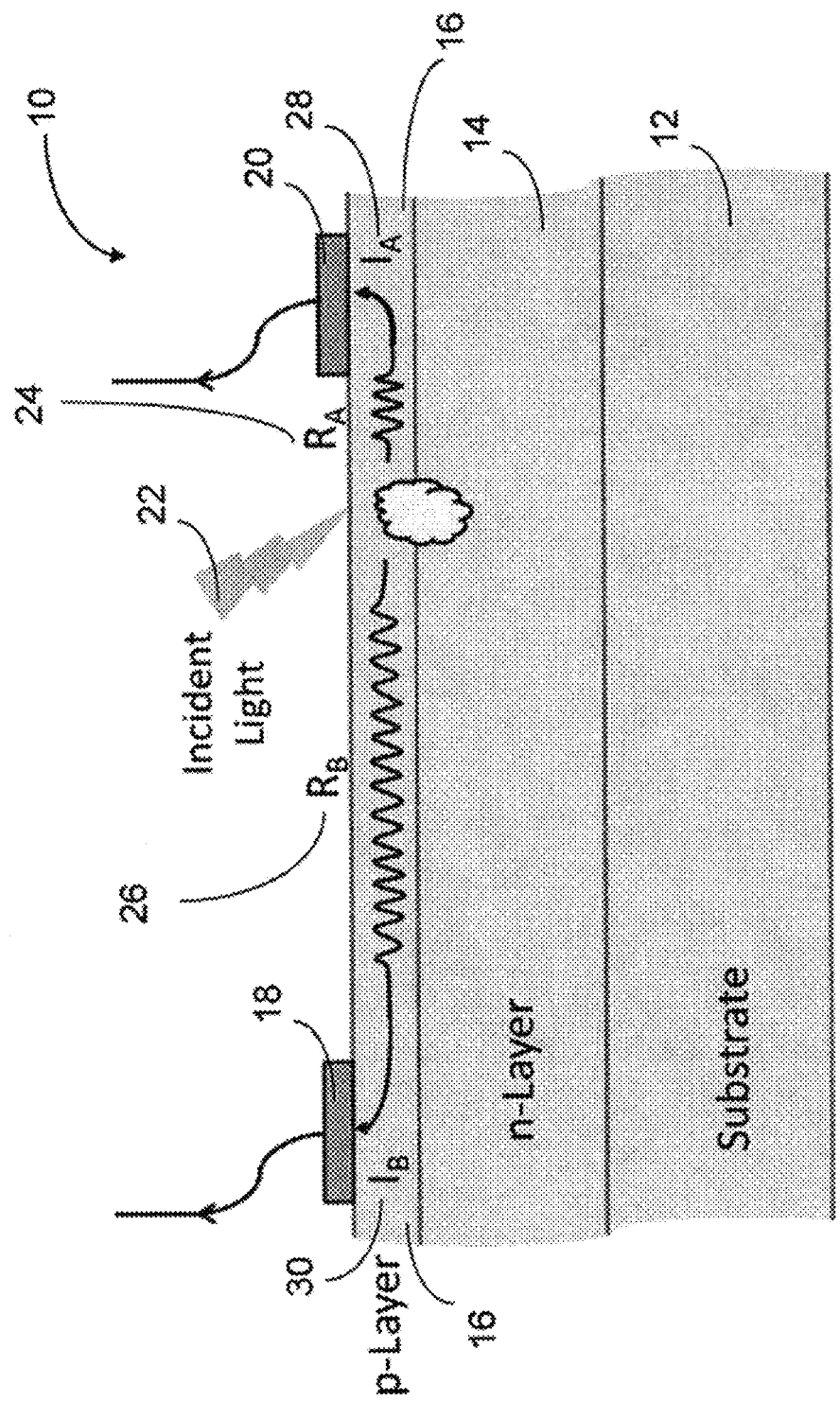
FIG. 1 shows an elevation sectional view of a PN junction position sensitive detector (PSD) in accordance with the prior art.

FIG. 1 shows an elevation sectional view of a PN junction position sensitive detector (PSD) in accordance with the prior art. FIG. 1 also illustrates the concept of operation of a PSD.

In the prior art, a contact layer 16 is on an absorber layer 14, which in turn is on a substrate 12. The contact layer 16 is typically a p− layer and the absorber layer 14 is typically an n− layer, thereby forming a PN junction. The contact layer 16 has a contact 18 on one end and a contact 20 on the other end. As described above, in the PSD prior art for mid wave infrared wavelengths HgCdTe material is used for the absorber layer.

The position sensitive detector is sensitive to the lateral position at which incident light 22 is incident on the contact layer 16 and the absorber layer 14. The incident light 22 generates carriers that diffuse from the absorber layer 14 to the contact layer 16. The resulting current to the contacts 18 and 20 is divided in proportion to the lateral resistances from the position of the incident light 22 to the contact 18 and to the contact 20.

Based on Ohm's law:

$$V_B = V_A \text{ or } R_B * I_B = R_A * I_A \qquad \text{Equation 1:}$$

where $R_A$ 24 is the lateral resistance between the position of the incident light and contact 20, and $I_A$ is the current at contact 20; and where $R_B$ 26 is the lateral resistance between the position of the incident light and contact 18, and $I_B$ is the current at contact 18.

If the distance between contact 18 and contact 20 in FIG. 1 is L, and X is the lateral position of the incident light, then Equation 1 can be rewritten as:

$$(0.5L+X)*I_B=(0.5L-X)*I_A, \text{ or}$$

$$X=0.5L*(I_A-I_B) \quad \text{Equation 2:}$$

Equation 2 is the PSD equation that gives the position of the incident light. In order to achieve high signal to noise ratio (S/N), the sheet resistance of top contact layer 16 should be high. Hence, a p-type contact layer 16 is preferred to an n-type due to the lower mobility of holes compared to the high mobility of electrons.

FIG. 2A shows an elevation sectional view of a position sensitive detector in accordance with the present disclosure. As shown in FIG. 2A, a contact layer 48 is on a barrier layer 44, which is over an absorber layer 42, which in turn is on a substrate 40. Contacts 50 and 52 are on the contact layer 48.

The contact layer 48 is a p– layer and may be indium arsenide antimonide (InAsSb) epi. The barrier layer 44 may be aluminum arsenide antimonide (AlAsSb) or aluminum gallium antimonide (AlGaSb) epi, and may be p– or n– doped. The absorber layer 42 is an n– layer epi and may be indium arsenide antimonide (InAsSb). The substrate 40 may be gallium arsenide (GaAs) or gallium antimodine (GaSb). The In AsSb epi materials for the contact layer 48 and the absorber layer 42 are III-V materials. The barrier layer 44, which is AlAsSb or AlGaSb is also a III-V material.

The contact layer 48 is a p– layer in order to achieve a high signal to noise ratio (S/N) and so that the sheet resistance of the contact layer 48 is relatively high. A p-type contact layer 48 is preferred to an n-type due to the lower mobility of holes, which may be 500 cm$^2$/volt*sec. compared to the high mobility of electrons, which may be 2E4 cm$^2$/volt*sec for InAsSb material. The resistance of the contact layer 48 may also be controlled by either the doping level or the thickness of the contact layer 48. However, it is necessary to ensure that thickness and/or the doping do not result in a p– contact layer 48 that is fully depleted.

Figure 3B:
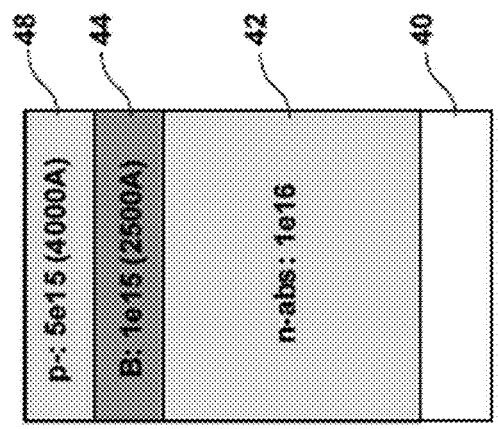
FIG. 3A shows a simulated band diagram for the position sensitive detector shown in FIG. 3B in accordance with the present disclosure.
Figure 3A:
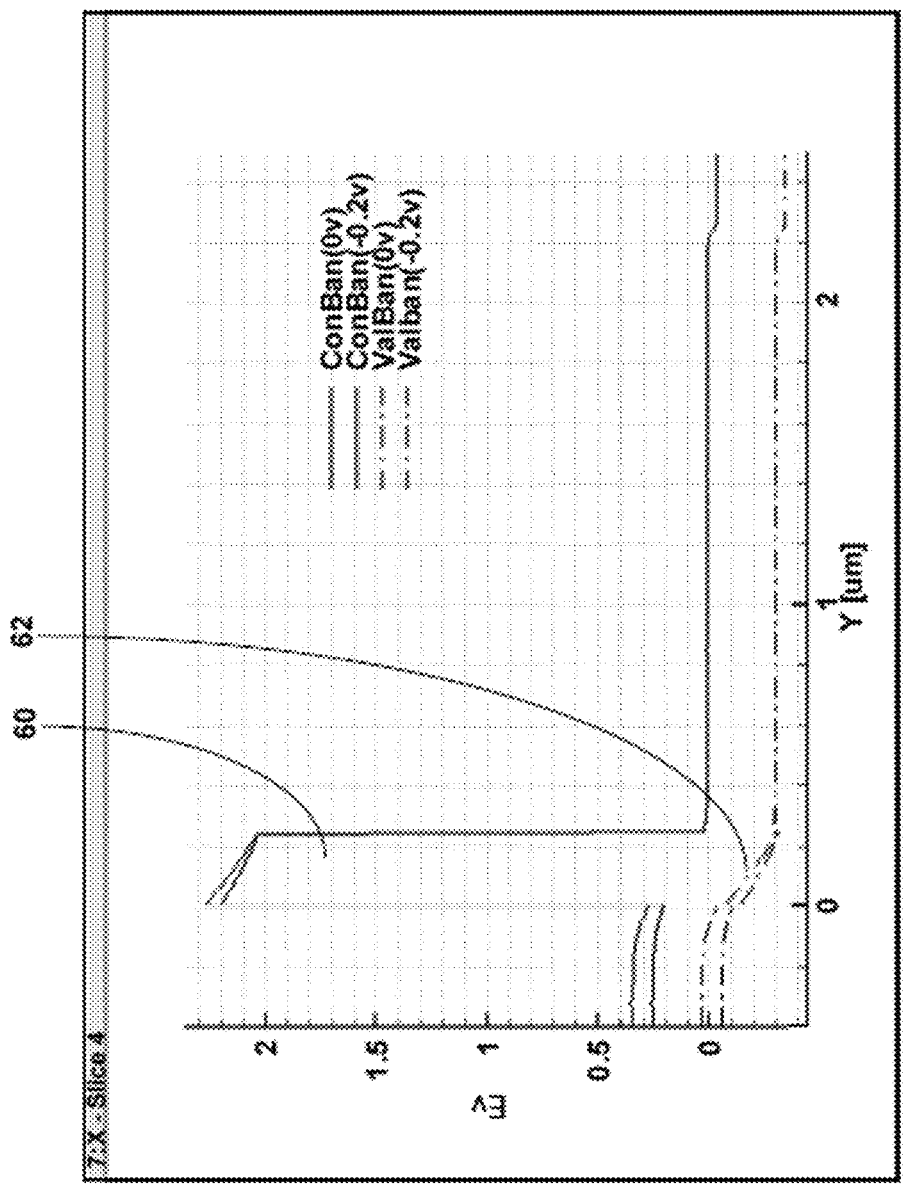

The barrier layer 44 reduces generation-recombination (G-R) current and minimizes depletion in the absorber layer 42. FIG. 3A shows the simulated band diagram for the structure of FIG. 2A, and the doping and thicknesses of FIG. 3B. The doping and thicknesses shown in FIG. 3B are just one example embodiment. In FIG. 3B, the contact layer 48 has a 5e15 p– doping and a 4000 Angstroms thickness, the barrier layer 44 has a n– or p– doping depending on the background doping of the molecular beam epitaxy (MBE) tool used and a thickness of 2500 Angstroms, and the absorber layer 42 has a 1e16 n– doping. As noted above, the doping levels and the thickness may be varied. For example, the barrier layer 44 thickness may range from 1000 Angstroms to 2500 Angstroms.

As shown in FIG. 3A, the barrier layer 44 has a large conduction band barrier 60 that prevents the flow of majority carrier electrons from the absorber layer 42 to the contact layer 48. However, because the valence band 62 has no barrier, minority carrier holes generated by the incident light can easily flow to the contact layer 48, thereby generating the current differences per Equation 1, so that the lateral position of the incident light can be derived using Equation 2 above.

Figures 4A, 4B:
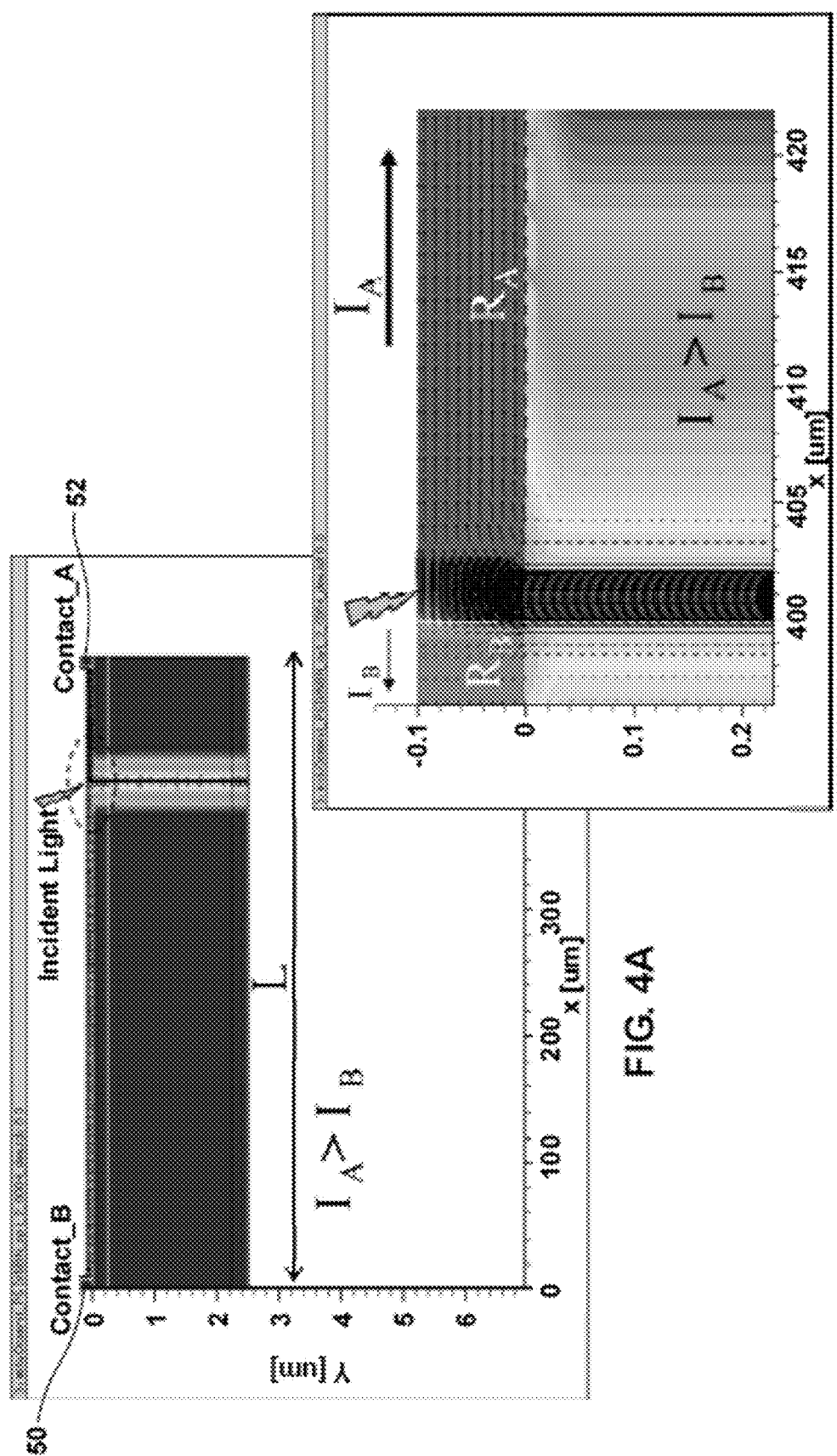
FIG. 4A shows a current density profile with non-symmetrical incident light in accordance with the present disclosure.
FIG. 4B shows a detail of the current density profile of FIG. 4A.

FIG. 4A shows a density profile for the embodiment of the PSD in FIGS. 2A and 3B with a non-symmetrical incident light. The simulation indicates that the current through contact 52 is larger than the current through contact 50, as expected. FIG. 4B shows a detail of the current density profile of FIG. 4A.

FIG. 2B shows an elevation sectional view of another position sensitive detector in accordance with the present disclosure. As shown in FIG. 2B, a contact layer 48 is on a compound barrier, which includes barrier layers 44 and 46. The barrier layer 44 is over barrier layer 46, which is over absorber layer 42, which in turn is on a substrate 40. Contacts 50 and 52 are on the contact layer 48.

As in the embodiment shown in FIG. 2A, the contact layer 48 is a p– layer and may be indium arsenide antimonide (InAsSb). The barrier layer 44 may be aluminum arsenide antimonide (AlAsSb) or aluminum gallium antimonide (AlGaSb), and may be p– or n– doped. The barrier layer 46 may be aluminum antimonide (AlSb). The absorber layer 42 is an n– layer and may be indium arsenide antimonide (InAsSb). The substrate 40 may be gallium arsenide (GaAs) or gallium antimodine (GaSb).

The InAsSb epi materials for the contact layer 48 and the absorber layer 42 are III-V materials. The barrier layers 44 and 46, which are AlAsSb or AlGaSb, and AlSb, respectively, are also a III-V material.

The position sensitive detectors of the present disclosure allow the fabrication of high performance, low cost PSDs, which can be built in arrays of PSDs, by using III-V InAsSb epi and the barrier layers described above. The position sensitive detectors according to the embodiments of FIGS. 2A and 2B can operate from the shortwave infrared to the mid wave infrared wavelengths, which are about 1 to 3 um, and 3-5.25 um, respectively.

The PSDs with either a single barrier layer, as shown in FIG. 2A, or the compound-barrier layers, as shown in FIG. 2B, may be operated at temperatures from 77 degrees Kelvin to 200 degrees Kelvin, which is much higher than the operating temperature possible with prior art PSDs. Such higher temperature operation further reduces the cost of a PSD system, because the cooling system can be less expensive. Also, it has been shown that InAsSb epi with a mid wave infrared wavelength cutoff of 5.25 um can be grown on 6 inch substrate 40 wafers, so PSD arrays according to the present disclosure may be built on large diameter wafers, which reduces cost.

FIG. 5 shows a flow diagram of a method of providing a position sensitive detector. In step 100 a substrate is provided. Then in step 102 an absorber layer is formed on the substrate. Next in step 104 a barrier layer is formed on the absorber layer. Then in step 106 a contact layer is formed on the barrier layer. Next in step 108 a first contact and a second contact are formed on the contact layer. As shown in step 110, the barrier layer prevents a flow of majority carriers from the absorber layer to the contact layer. As shown in step 112 the position sensitive detector is sensitive to a lateral position between the first contact and the second contact of incident light on the contact layer.

Then in step 114 the lateral position x of the incident light is determined by calculating $X=0.5\ L*(I_A-I_B)/(I_A+I_B)$, where L is a distance between the first contact and the second contact, where $I_A$ is a current at the first contact, and where $I_B$ is a current at the second contact.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. A method of providing a position sensitive detector comprising:
    providing a substrate;
    forming an absorber layer on the substrate;
    forming a barrier layer on the absorber layer;
    forming a contact layer on the barrier layer; and
    forming a first contact and a second contact on the contact layer;
    wherein the barrier layer comprises a first barrier layer on the absorber layer, and a second barrier layer on the first barrier layer;
    wherein the barrier layer prevents a flow of majority carriers from the absorber layer to the contact layer;
    wherein the contact layer is a continuous layer between the first contact and the second contact; and
    wherein the position sensitive detector is sensitive to a lateral position between the first contact and the second contact of incident light on the contact layer.

2. The method of claim 1 wherein:
    the contact layer comprises p– doped InAsSb; and
    the absorber layer comprises n– doped InAsSb.

3. The method of claim 2 wherein:
    the barrier layer comprises AlAsSb or AlGaSb.

4. The method of claim 1 wherein:
    the substrate comprises GaAs or GaSb.

5. The method of claim 1 further comprising:
    determining the lateral position X of the incident light by calculating $X=0.5\ L^*(I_A-I_B)/(I_A+I_B)$;
    where L is a distance between the first contact and the second contact;
    where $I_A$ is a current at the first contact; and
    where $I_B$ is a current at the second contact.

6. The method of claim 1 wherein:
    the majority carriers are electrons; and
    wherein minority carriers comprising holes are not prevented from flowing from the absorber layer to the contact layer.

7. The method of claim 1 wherein:
    the contact layer has a thickness of about 4000 Angstroms; and
    the barrier layer has a thickness of 1000 Angstroms to 2500 Angstroms.

8. The method of claim 3 wherein
    the contact layer has a 5e15 doping level;
    the barrier layer has a 1e15 doping level; and
    the absorber layer has a 1e16 doping level.

9. The method of claim 1 wherein the operating temperature of the position sensitive detector ranges from 77 degrees Kelvin to 200 degrees Kelvin.

10. The method of claim 1 wherein the position sensitive detector is sensitive to short wave infrared and mid wave infrared wavelengths.

11. The method of claim 1 wherein:
    the first barrier layer comprises AlSb; and
    the second barrier layer comprises AlAsSb or AlGaSb.

12. The method of claim 1 wherein:
    the contact layer comprises p– doped InAsSb;
    the barrier layer comprises AlAsSb or AlGaSb;
    the absorber layer comprises n– doped InAsSb; and
    the substrate comprises GaAs or GaSb.

* * * * *